(12) United States Patent
Burch et al.

(10) Patent No.: US 6,247,163 B1
(45) Date of Patent: Jun. 12, 2001

(54) METHOD AND SYSTEM OF LATCH MAPPING FOR COMBINATIONAL EQUIVALENCE CHECKING

(75) Inventors: Jerry R. Burch, San Francisco; Vigyan Singhal, Fremont, both of CA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 09/172,708

(22) Filed: Oct. 13, 1998

(51) Int. Cl.$^7$ .................................................. G06F 15/60
(52) U.S. Cl. ............................................................ 716/3
(58) Field of Search ............................................ 716/3, 5

(56) References Cited

U.S. PATENT DOCUMENTS

| 5,638,381 | 6/1997 | Cho et al. | 371/22.4 |
| 6,035,109 | * 3/2000 | Ashar | 716/3 |

OTHER PUBLICATIONS

C. A. J. van Eijk; *Sequential Equilvalence Checking Without State Space Transversal*; 1998 EDAA.
C. A. J. van Eijk; *Formal Methods for the Verification of Digital Circuits*; Sep. 1997.

* cited by examiner

Primary Examiner—Matthew Smith
Assistant Examiner—Thuan Do
(74) Attorney, Agent, or Firm—Lyon & Lyon LLP (57) ABSTRACT

A method and system of latch mapping for performing combinational equivalence checking on a specification and an implementation of a circuit that does not depend on signal names or circuit structure to determine the latch mapping. First, every latch is mapped to every other latch. Then, the resulting mapping is refined until it is semi-inductive. The refinement is performed by randomly producing a state that satisfies the mapping and applying a random input vector to the circuits. The resulting mappings are iteratively compared and new input vectors are applied to the circuits until the greatest fixed point of the refinement is found. Then, it is determined whether the greatest fixed point of refinement forces output equality. If the greatest fixed point does not force output equality, then a bug in a combinational block of the implementation is localized through an interactive procedure. If the greatest fixed point does force output equality, then it is determined whether it also satisfies a reset condition. If implementation latches are not mapped together, then conformance with the reset condition is guaranteed. Otherwise, conformance can be guaranteed only if the implementation latches mapped together are assumed to have the same value in the reset state. The method and system is also extended to cover ternary latch mappings having "don't care" conditions.

20 Claims, 7 Drawing Sheets

METHOD AND SYSTEM OF LATCH MAPPING FOR COMBINATIONAL EQUIVALENCE CHECKING

BACKGROUND

1. Field of the Invention

This invention pertains generally to digital circuit design and particularly to combinational equivalence verification.

2. Background of the Invention

Today's logic circuits are so complex that circuit designers must use computer-based techniques to help them in their task. Some of these techniques transform a specification of a circuit into an equivalent implementation of the circuit. During this transformation, errors may be introduced into the implementation. Accordingly, checking must be performed to verify that the implementation conforms with the specification. Combinational equivalence checking is one form of checking.

When applied to a pair of sequential circuits, combinational equivalence checking typically consists of two steps: latch mapping and verification. The first step constructs a latch mapping (also known as a register mapping) by identifying corresponding latches in the two designs to be compared. Then, it is possible to break the circuits into corresponding combinational blocks (e.g., single-output, multiple-input Boolean functional blocks). The second step is to verify whether the corresponding combinational blocks are equivalent. If the corresponding blocks are equivalent, the circuits are functionally equivalent.

There has been much research on the second step, verification. For example, A. Kuehlmann and F. Krohm, "Equivalence Checking Using Cuts and Heaps," DAC, 1997, and D. K. Pradhan, D. Paul, and M. Chatterjee, "VERILAT: Verification Using Logic Augmentation and Transformations," ICCAD, 1996, are recent examples. However, there has been little research on the first step, constructing a latch mapping.

Existing commercial tools for constructing a latch mapping use heuristics based on signal names or circuit structure. However, tools that perform design transformations such as synthesis or clock tree insertion often do not preserve signal names, especially when a design is flattened as part of the transformation. If two combinational blocks are found to be inequivalent, it may be because of an incorrect latch mapping rather than a bug in the circuit. This possible error in the latch mapping complicates debugging.

Accordingly, there is a need for a method and system for constructing a latch mapping that accurately maps corresponding latches in the two circuit designs. Preferably, the method and system should not use heuristics based on signal names or circuit structure to construct the latch mapping.

SUMMARY OF THE INVENTION

The above needs are met by a method and system for performing latch mapping for combinational equivalence checking that is not based on signal names. The method and system start with two circuits: an implementation and a specification. The state holding elements of each circuit are referred to as "latches." The latches are represented as L, the states are represented as S, and a transition function $\delta$ is defined. Given an input vector I and a state S, the transition function $\delta$ produces the next state. In addition, a predicate P is defined to be semi-inductive if $\forall S\ \forall I\ [P(S) \Rightarrow P(\delta(S,I))]$. Latch mappings are represented with a predicate M such that latches $l_1$ and $l_2$ are mapped together if and only if $M(l_1, l_2)$ is true.

The method and system construct an initial mapping that, in one embodiment, maps every latch to every other latch. This mapping is then iteratively refined until it is semi-inductive. The refinement is performed by randomly producing a state that satisfies the mapping. Then, a random input vector is applied to the circuits and the resulting state is determined. If the resulting state does not satisfy the mapping, then a new mapping is constructed reflecting the resulting state. This new mapping is a refinement of the previous mapping.

If the resulting state after the random input vector is applied satisfies the mapping, then, for each pair of latches mapped together, combinational equivalence checking is used to show whether the combinational blocks that drive the pair of latches are equivalent for all combined states that satisfy the mapping. If the blocks are not equivalent, the combinational equivalence checker will produce a counter-example including an input vector. The input vector is applied to the circuits and a new mapping is constructed reflecting the resulting state. If every pair of latches that is mapped together is examined without producing a counter-example, then the mapping is semi-inductive. This mapping is called M*.

Once M* is found, the next determination is whether it forces output equality. This determination is performed by using combinational equivalence checking on the combinational blocks driving the primary outputs of the implementation and specification.

If M* does not force output equality, then the two circuits are not combinationally equivalent. Accordingly, the present invention includes an interactive procedure for locating a bug in a combinational block of the implementation. The user determines whether the latches of the local inputs to the combinational blocks that drive the outputs in the implementation and the specification are properly mapped together. If the latches are properly mapped together, then there is a bug in a combinational block driving the output of the implementation. Otherwise, the user selects a mapping for the latches that are local inputs to the combinational blocks driving the previously selected latches. This process iterates until the combinational block having the bug is found.

If M* does force output equality, then the next determination is whether the implementation satisfies a supplied reset condition, if any. The implementation satisfies a reset condition if there are no implementation latches mapped together in M*. If implementation latches are mapped in the same equivalence class, then the implementation can be guaranteed to conform with the specification only if the implementation latches mapped together are assumed to have the same value in the reset state.

In one embodiment, the method and system for performing latch mapping is expanded to cover ternary latch mappings having "don't care" conditions. When used with ternary latch mappings, the method and system define a pre-order, rather than an equivalence relation, between the latches. Conformance relationships are described with classes having links between them representing those classes having latches that are strictly less than the latches of another class. One embodiment determines conformance relationships by selecting a representative latch from each class and testing for conformance among the representative latches.

DETAILED DESCRIPTION OF THE PREFERRED EMBODIMENTS

Equivalence checking is performed between two circuits: an implementation circuit and a specification circuit. This description assumes that the two circuits have a single clock and have the same number of inputs and outputs. Systems and methods for converting circuit models with more than one clock into models with a single clock are well known in the art. Let $n_I$ and $n_O$ be the number of inputs and outputs, respectively, of the circuits. Let I and O denote the input and output vectors, respectively.

In this description, the term "latches" refers to state holding, or memory, elements of the circuits. $L_{Impl}$ and $L_{Spec}$ are the set of latches of the implementation and the specification, respectively. Let $L=L_{Impl} \cup L_{Spec}$ be the combined set of latches and S be a combined state, i.e. S: $L \rightarrow \{0,1\}$. $S_{Impl}$ and $S_{Spec}$ respectively denote the projection of S onto $L_{Impl}$ and $L_{Spec}$. Thus, $S_{Impl}$ and $S_{Spec}$ represent the states of the individual circuits while S represents their combined state. $S_{Impl} \cup S_{Spec}$ denotes the recombining of $S_{Impl}$ and $S_{Spec}$ to form the combined state S.

$\delta_{Impl}$ is the transition function of the implementation, i.e., given an input vector I and a state $S_{Impl}$, $\delta_{Impl}(S_{Impl}, I)$ is the next state. The transition function of the specification, $\delta_{Spec}$, is analogously defined. The combined transition function $\delta$ is the result of combining $\delta_{Impl}$ and $\delta_{Spec}$: given an input vector I and a combined state S, $\delta(S, I)$ is the next combined state.

$\gamma_{Impl}$ is the output function of the implementation and $\gamma_{Impl}(S_{Impl}, I)$ is the output vector O for the implementation state $S_{Impl}$ and input vector I. The output function $\gamma_{Spec}$ of the specification is analogously defined.

The present invention does not require that the user provide a reset state or states for the circuits being compared. However, reasoning about the relationship between combinational and sequential equivalence requires considering the possible reset states of the circuits, even if all circuit states are considered possible reset states. $R_{Impl}$ and $R_{Spec}$ are the set of reset states of the implementation and the specification, respectively. A predicate $P_{Impl}$ is defined to be inductive if $\forall S_{Impl} [R_{Impl}(S_{Impl}) \Rightarrow P_{Impl}(S_{Impl})]$ and $\forall S_{Impl} \forall I [P_{Impl}(S_{Impl}) \Rightarrow P_{Impl}(\delta_{Impl}(S_{Impl}, I))]$. If $P_{Impl}$ is inductive, then it contains all reachable implementation states.

This description does not distinguish between a predicate and the set of all objects that satisfy the predicate. Also, predicates are often used on combined states rather than on implementation states. Thus, the reset states of both the implementation and specification must be considered. As a result, the notion of an inductive predicate (which considers the reset states of only one state machine) is not adequate. To address this issue, a predicate P is first defined on combined states to be semi-inductive if $\forall S \forall I [P(S) \Rightarrow P(\delta(S, I))]$. This definition corresponds to the second condition in the definition of an inductive predicate, i.e. $\forall S_{Impl} \forall I [P_{Impl}(\delta_{Impl}) \Rightarrow P_{Impl}(\delta_{Impl}(S_{Impl}, I))]$. Second, the following reset condition on a predicate P is defined on combined states: $\forall S_{Impl} \in R_{Impl} [\exists S_{Spec} \in R_{Spec} [P(S_{Impl} \cup S_{Spec})]]$.

Typically, combinational verification tools determine whether the implementation is equivalent to the specification. However, the specification may have more reset states (and, therefore, more possible execution traces) than the implementation. In this case, the implementation could be safely substituted for the specification, although the two circuits are not equivalent. To handle this situation, this description formalizes what it means for the implementation to conform to the specification.

First, however, an auxiliary definition is required. The implementation and the specification are sequentially equivalent for the initial combined state $S_0$ if and only if (iff) for all input vectors I and all combined states S reachable from $S_0$, $\gamma_{Impl}(S_{Impl}, I) = \gamma_{Spec}(S_{Spec}, I)$. Let P be the set of all states $S_0$ such that the implementation and the specification are sequentially equivalent for the initial combined state $S_0$. The implementation conforms to the specification iff P satisfies the reset condition. Finally, a predicate P on combined states forces output equality iff $\forall S \forall I [P(S) \Rightarrow \gamma_{Impl}(S_{Impl}, I)]$.

Theorem 1: The implementation conforms to the specification if and only if there exists a predicate P that is semi-inductive, forces output equality, and satisfies the reset condition.

Proof: The forward implication follows by letting P be the set of all combined states S such that the implementation and the specification are sequentially equivalent for the initial combined state S. The reverse implication follows from the definitions using induction on the length of sequences of input vectors. QED.

1. Boolean Latch Mappings

Latch mappings are represented with a predicate M. The latches $l_0$ and $l_1$ are mapped together iff $M(l_0, l_1)$ is true. M is not required to be a one-to-one mapping; it can be an arbitrary equivalence relation. For example, two latches in the implementation may be mapped to a single latch in the specification.

A combined state S satisfies M if any two latches that are mapped together by M have the same value in S. Let $P_M$ be the set of combined states S that satisfy M: $P_M(S) \leftrightarrow \forall l_0 \forall l_1 [M(l_0, l_1) \Rightarrow S(l_0) = S(l_1)]$.

Several of the properties defined for predicates are extended to latch mappings. A latch mapping M is semi-inductive if the predicate $P_M$ is semi-inductive. A mapping M forces output equality if $P_M$ forces output equality. Finally, a mapping M satisfies the reset condition if $P_M$ satisfies the reset condition.

$M_1$ is a refinement of $M_0$ (also written as $M_1 \subseteq M_0$) if $\forall l_0 \forall l_1 [M_1(l_0, l_1) \Rightarrow M_0(l_0, l_1)]$. If $M_1 \subseteq M_0$, then the set of combined states that satisfy $M_1$ is larger than the set of combined states that satisfy $M_0$, as in the following theorem.

Theorem 2: If $M_1 \subseteq M_0$, then $\forall S [P_{M_0}(S) \Rightarrow P_{M_1}(S)]$.

Proof: Theorem 2 is proved by contradiction. Assume the theorem is false. That is, assume that $M_1 \subseteq M_0$ and there exists an S such that $P_{M_0}(S)$ is true and $P_{M_1}(S)$ is false. Since $P_{M_1}(S)$ is false, there exist latches $l_0$ and $l_1$ such that $M_1(l_0, l_1)$ is true and $S(l_0) \neq S(l_1)$. Since $M_1 \subseteq M_0$ and $M_1(l_0, l_1)$ is true, it follows that $M_0(l_0, l_1)$ is also true. Thus, since $S(l_0) \neq S(l_1)$, it follows that $P_{M_0}(S)$ is false. However, this contradicts the assumption that $P_{M_0}(S)$ is true. QED.

Figure 1:
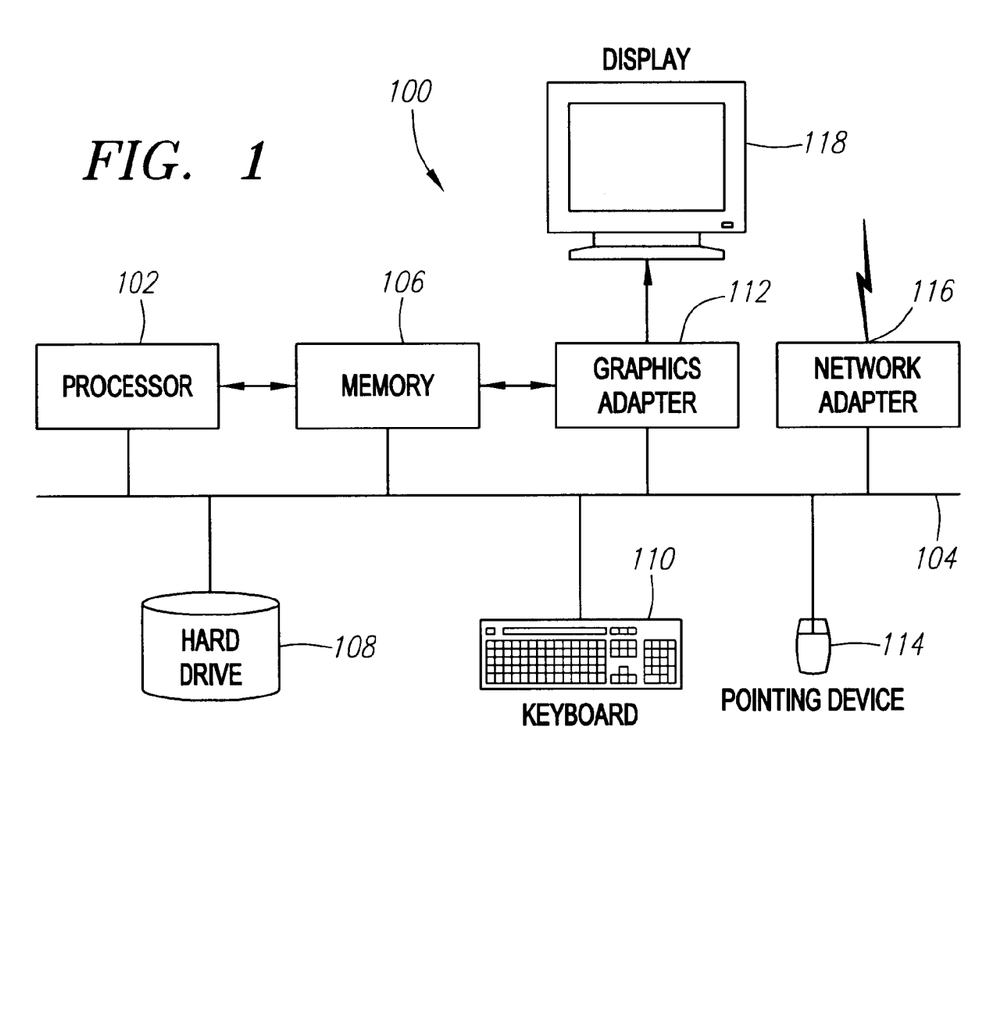
FIG. 1 is a high-level block diagram of a computer system for performing latch mapping according to one embodiment of the present invention.

FIG. 1 is a high-level block diagram of a computer system 100 for performing latch mapping according to one embodiment of the present invention. Illustrated are at least one processor 102 coupled to a bus 104. Also coupled to the bus 104 are a memory 106, a storage device 108, a keyboard 110, a graphics adapter 112, a pointing device 114, and a network adapter 116. A display 118 is coupled to the graphics adapter 112.

The at least one processor 102 may be any general-purpose processor such as an INTEL x86-compatible or SUN MICROSYSTEMS SPARC-compatible central processing unit (CPU). The storage device 108 may be any device capable of holding large amounts of data, like a hard drive, compact disk read-only memory (CD-ROM), DVD, or some form of removable storage device. The memory 106 holds instructions and data used by the processor 102. The pointing device 114 may be a mouse, track ball, light pen, touch-sensitive display, or other type of pointing device and is used in combination with the keyboard 110 to input data into the computer system 100. The graphics adapter 112 displays images and other information on the display 118. The network adapter 116 couples the computer system 100 to a local or wide area network (not shown).

A program for performing latch mapping according to one embodiment of the present invention is stored on the storage device 108, loaded from memory 106, and executed on the processor 102. Alternatively, hardware or software modules may be stored elsewhere within the computer system 100 for performing latch mapping as described herein.

Figure 2:
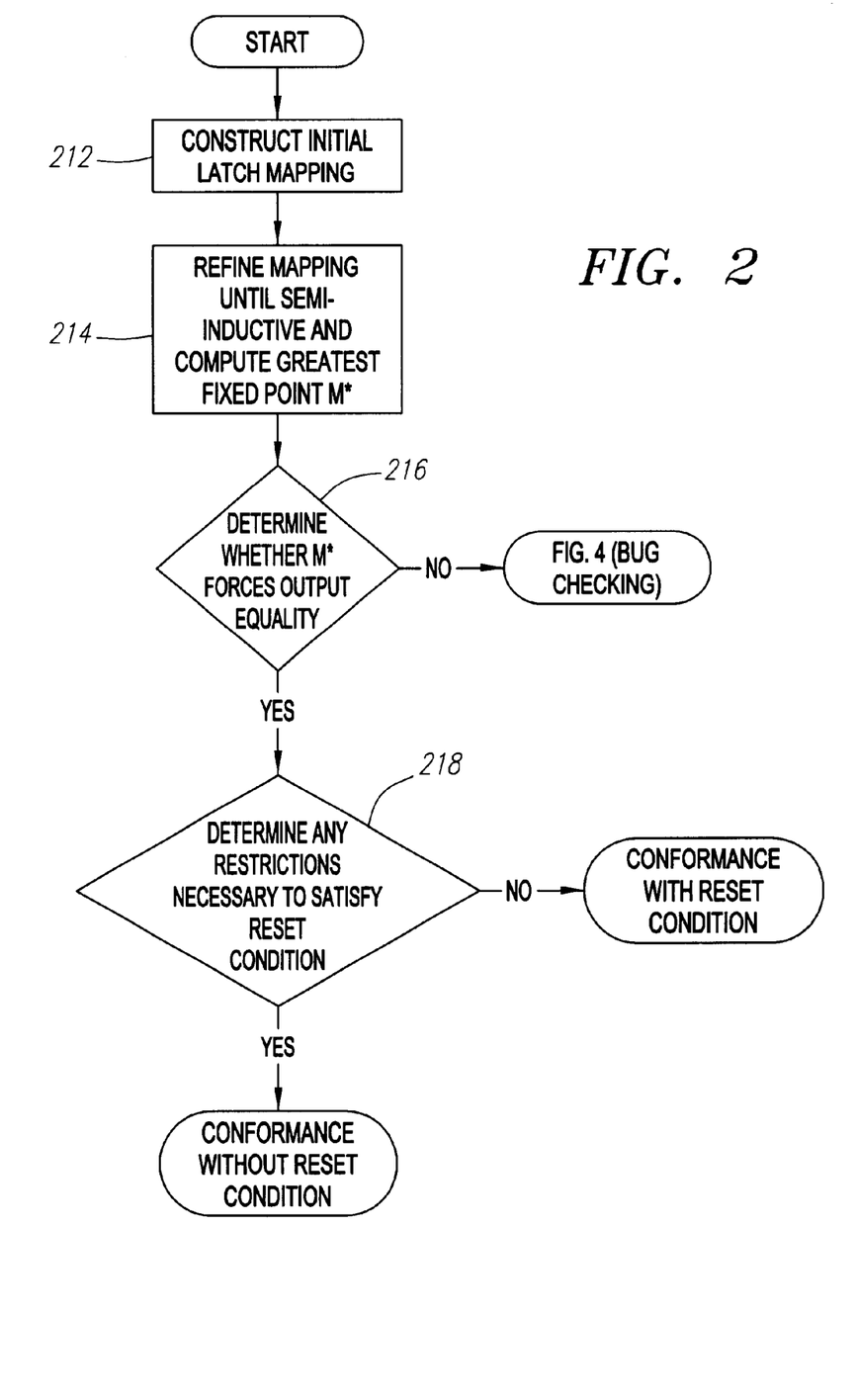
FIG. 2 is a flowchart illustrating steps for performing latch mapping for combinational equivalence checking according to a preferred embodiment of the present invention.

FIG. 2 is a flowchart illustrating steps for performing latch mapping for combinational equivalence checking of a specification circuit and an implementation circuit according to a preferred embodiment of the present invention. An initial latch mapping $M_0$ is constructed 212. In a typical case, the initial latch mapping $M_0$ maps every latch to every other latch: $\forall l_0 \forall l_1 \, M_0(l_0, l_1)$. However, another latch mapping may be used if it is guaranteed that those latches not mapped together need not be mapped together in the final mapping.

Next, the mapping $M_0$ is iteratively refined 214 until it is semi-inductive. This step is formalized using a function $\Phi$ that takes a mapping $M_n$ and returns a mapping $M_{n+1}$ that is a refinement of $M_n$. The present invention uses a refining function $\Phi$ that meets the following two conditions:

M is a fixed point of $\Phi$ (i.e., $M=\Phi(M)$) iff M is semi-inductive; and     1)

$\Phi$ is monotonic, which means that if $M_1 \subseteq M_0$, then $\Phi(M_1) \subseteq \Phi(M_0)$.     2)

As described below with respect to FIG. 3, the refining function $\Phi$ is iteratively applied until a semi-inductive mapping M is found. This semi-inductive mapping M is the greatest fixed point $M^*$. Recall that a fixed point of $\Phi$ is a mapping M such that $\Phi(M)=M$. $M^*$ is the greatest fixed point of $\Phi$ if $M^*$ contains every ordered pair of latches that is in any fixed point M of $\Phi$. The greatest fixed point of $\Phi$ must exist and can be computed in a finite number of steps because $\Phi$ is monotonic and because there is a finite number of latches.

The following theorem shows how the latch mapping $M^*$ that is the greatest fixed point of $\Phi$ can be used to determine whether the implementation conforms to the specification:

Theorem 3: If M is a fixed point of a refining function $\Phi$, forces output equality, and satisfies the reset condition, then the implementation conforms to the specification.

Proof: By condition 1 of the definition of a refining function, M is semi-inductive. Since M is semi-inductive, forces output equality, and satisfies the reset condition, $P_M$ is semi-inductive, forces output equality, and satisfies the reset condition. Thus, the result follows from Theorem 1. QED.

Next, it is necessary to determine 216 whether $M^*$ forces output equality. This determination is performed by using combinational equivalence checking on the combinational blocks driving the primary outputs of the implementation and the specification. $M^*$ provides the mapping between the latches that are local inputs to these combinational blocks.

The previous theorems are applicable when the implementation conforms to the specification and, accordingly, $M^*$ forces output equality. Theorem 4 can be used (when applicable) to show that the implementation does not conform to the specification.

Theorem 4: Let $M^*$ be the greatest fixed point of a refining function $\Phi$. Assume that $M^*$ does not force output equality. Then, there does not exist a latch mapping M that is semi-inductive and forces output equality. Thus, by Theorem 1, the implementation does not conform to the specification.

Proof: Theorem 4 is proved by assuming there is such an M and then showing that this assumption leads to a contradiction. By condition 1 of the definition of a refining function, i.e., $M=\Phi(M)$ iff M is semi-inductive, any semi-inductive mapping must be a refinement of $M^*$. Thus, $M \subseteq M^*$. By Theorem 2, $P_M$ is weaker than $P_{M^*}$. Clearly, $P_{M^*}$ does not force output equality, so $P_M$ also does not force output equality. This contradicts the assumption that M forces output equality. QED.

Figures 4, 5:
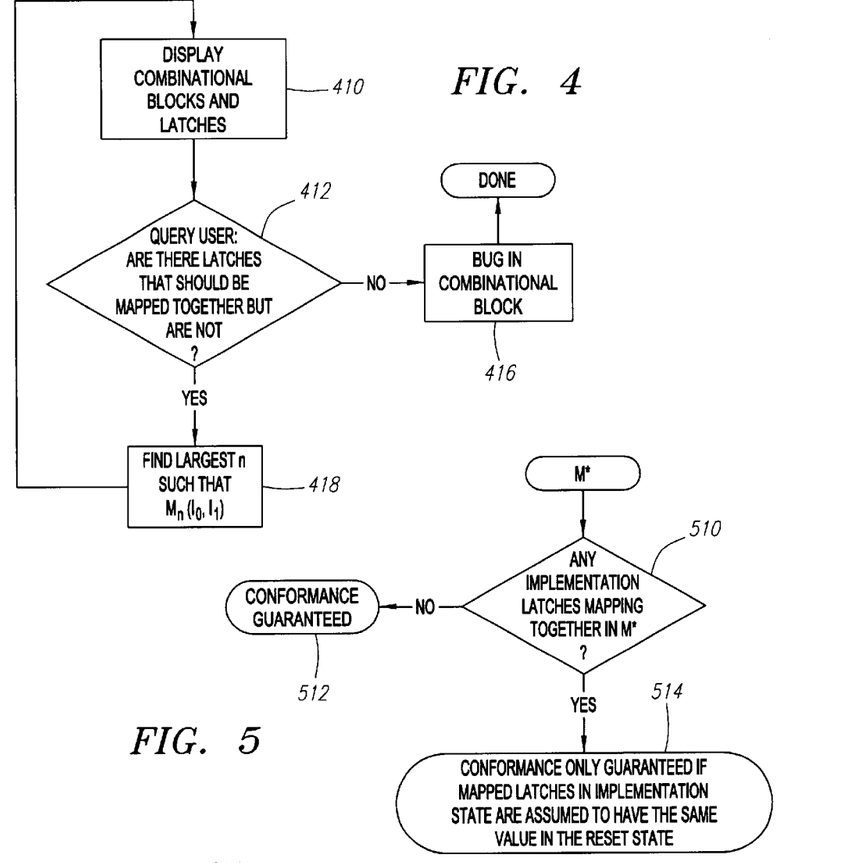
FIG. 4 is a flowchart illustrating how to localize bugs in the implementation when conformance cannot be shown according to a preferred embodiment of the present invention.
FIG. 5 is a flowchart illustrating steps performed by a preferred embodiment of the present invention to determine whether M* satisfies the reset condition.

Accordingly, if $M^*$ does not force output equality at step 216, then conformance cannot be shown using combinational methods. FIG. 4, described below, illustrates how to localize bugs in the implementation when conformance cannot be shown. If $M^*$ does force output equality, then the remaining step is to determine 218 what restrictions, if any, need to be placed on $R_{Impl}$ in order for $M^*$ to satisfy the reset condition. This determination 218 is described with respect to FIG. 5.

Figure 3A:
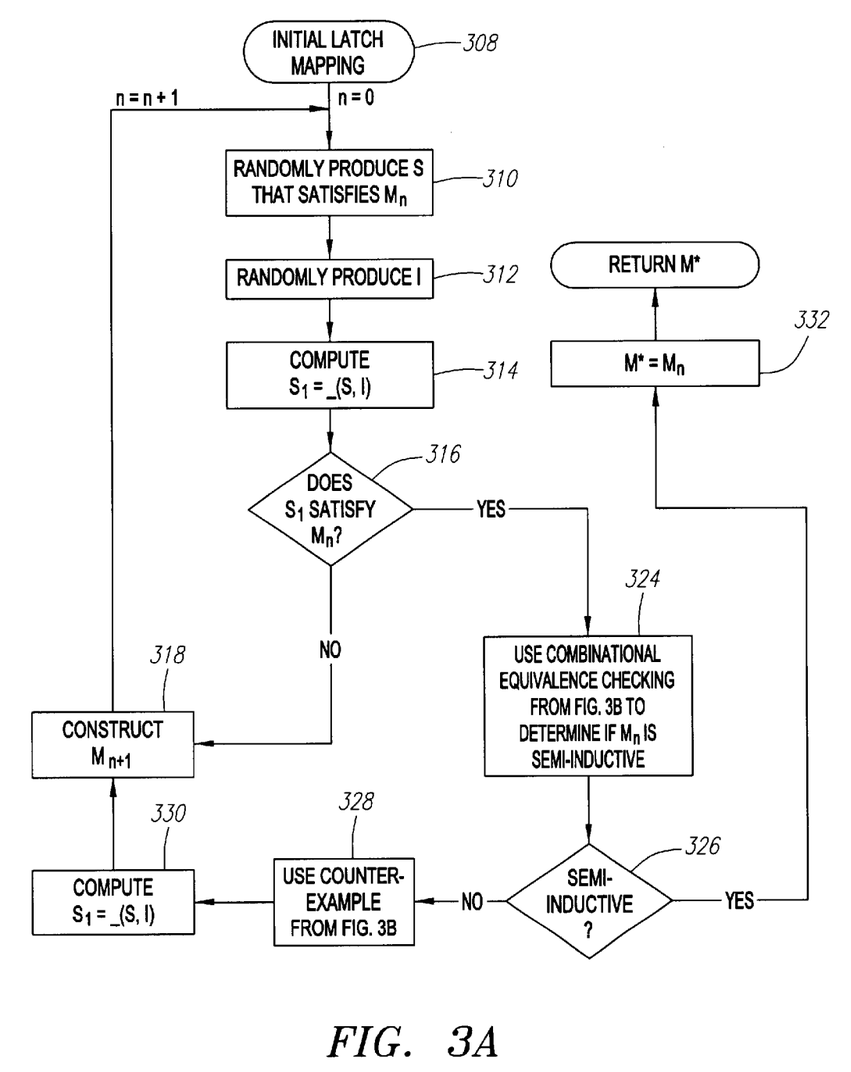
FIGS. 3A and 3B are flowcharts illustrating how a refinement is computed and the greatest fixed point mapping if found according to a preferred embodiment of the present invention.

FIG. 3 is a flow chart illustrating how a refinement of a mapping and the greatest fixed point $M^*$ of $\Phi$ are computed according to a preferred embodiment of the present invention. A latch mapping M is an equivalence relation between latches. Thus, M can be represented efficiently as a partition of the set of latches. Data structures for representing equivalence classes of latches are well known in the art and need not be discussed in detail herein.

The steps of FIG. 3, given a latch mapping $M_n$, compute $M_{n+1}=\Phi(M_n)$, where $\Phi$ is a refining function as defined above. The initial mapping $M_n$ 308 is the latch mapping determined at step 212. As mentioned above, the initial latch mapping is typically a mapping where every latch is mapped to every other latch, i.e., all latches are in the same equivalence class.

Next, a combined state S that satisfies $M_n$ is produced 310. The combined state S is preferably produced by randomly assigning Boolean values to the equivalence classes $M_n$, and then constructing S so that every latch 1 has the value assigned to the equivalence class of which 1 is a member. In addition, an input vector I is randomly produced 312.

Next, $S_1=\delta(S, I)$ is computed 314. If $S_1$ does not satisfy 316 $M_n$, then $M_{n+1}$ is constructed 318 such that for all $l_0$ and $l_1$, $M_{n+1}(l_0, l_1)$ iff $M_n(l_0, l_1)$ and $S_1(l_0)=S_1(l_1)$. Clearly, $M_{n+1} \subseteq M_n$. Because $S_1$ does not satisfy $M_n$, $M_n \neq M_{n+1}$. Then, $M_{n+1}$ becomes the starting mapping $M_n$ for another iteration of the procedure.

Figure 3B:
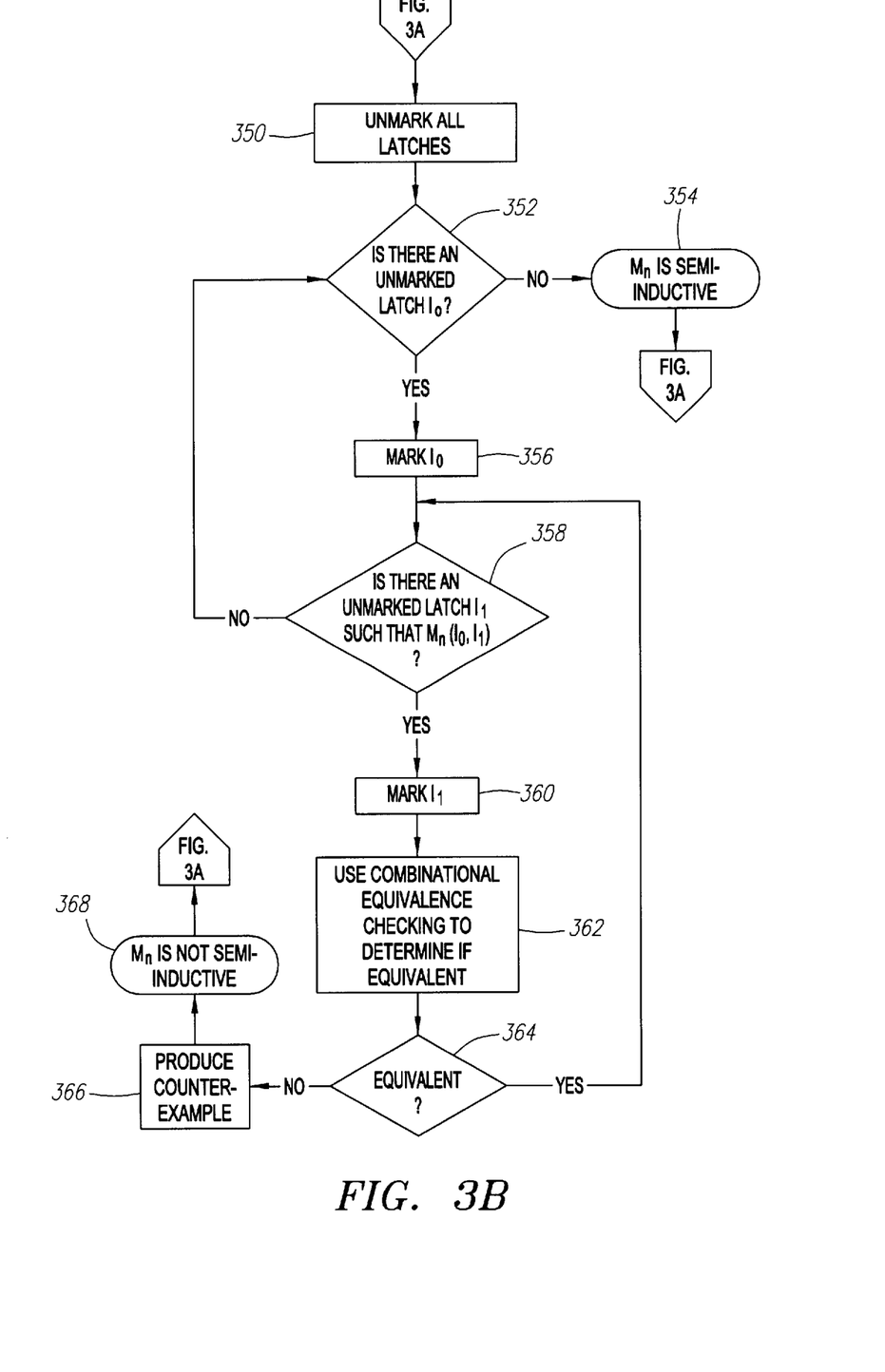

If $S_1$ does satisfy 316 $M_n$, then combinational equivalence checking is used 324 as described with respect to FIG. 3B to determine whether $M_n$ is semi-inductive. If $M_n$ is semi-inductive, then it is the greatest fixed point $M^*$ of $\Phi$. Accordingly, $M^*$ is set 332 equal to $M_n$ and $M^*$ is returned.

If $M_n$ is not semi-inductive 326, then the combinational equivalence checker will produce a counter-example: a combined state S and an input vector I such that $\delta(S, I)(l_0) \neq \delta(S, I)(l_1)$. This counter-example is used to compute 330 $S_1 = \delta(S, I)$ and a new mapping $M_{n+1}$ is then computed 318.

As the above procedure is executed, it records the sequence of the $M_n$ that are produced and also records the sequences of the S and I that are computed during each evaluation of $\Phi$.

FIG. 3B is a flowchart illustrating steps for performing combinational equivalence checking to determine if $M_n$ is semi-inductive. In short, the flowchart of FIG. 3B uses combinational equivalence checking to determine, for each equivalence class, whether any two latches in the equivalence class are equivalent.

First, all of the latches in $M_n$ are unmarked 350. In this description, marking or unmarking a latch merely means to record whether a particular match has been considered. Then, a latch $l_0$ in a first equivalence class is selected 352 and marked 356. If there is an unmarked latch $l_1$ mapped together with $l_0$ in the mapping $M_n$, then the latch $l_1$ is marked 360.

Next, combinational equivalence checking is performed on the mapping $M_n(l_0, l_1)$ to determine whether $l_0$ and $l_1$ are equivalent 364. If $l_0$ and $l_1$ are equivalent 362, and there is 358 another latch $l_1$ in the same equivalence class as latch $l_0$, the new latch $l_1$ is chosen and marked 360. Then, the combinational equivalence checking step 362 is repeated with the new mapping $M_n(l_0, l_1)$. The steps of marking 356, 360 and checking 362 are repeated until all of the latches are marked or combinational equivalence checking 362 determines that two latches mapped together are not equivalent.

If $l_0$ and $l_1$ are not equivalent 364, then the combinational equivalence checker will produce 366 a counter-example: a combined state S and an input vector I such that $\delta(S, I)(l_0) \neq \delta(S, I)(l_1)$. By definition, $M_n$ cannot be semi-inductive if two latches mapped together are not equivalent.

If there are no unmarked latches at decision 352, i.e. every latch in every equivalence class has been considered without finding an incorrect mapping, then the mapping $M_n$ is semi-inductive 354.

FIG. 4 is a flowchart illustrating how to localize bugs in the implementation when conformance cannot be shown, e.g., $M^*$ does not force output equality 216, according to a preferred embodiment of the present invention. In this case, it is necessary to provide debugging information to a user of the equivalence checker. The flowchart illustrated in FIG. 4 describes an interactive procedure that can localize a bug in the implementation. If there is more than one incorrect combinational block in the implementation, the procedure will home in on one of the incorrect blocks.

The steps illustrated in FIG. 3 produce a length k sequence of latch mappings $M_n$, each a refinement of its predecessors. The steps also produce length k-1 sequences of combined states $S_n$ and input vectors $I_n$. For all n between 0 and k-2 inclusive, $P_{M_n}(S_n)$ holds true and $\forall l_0 \forall l_1[(M_n(l_0, l_1) \land \neg M_{n+1}(l_0, l_1)) \Rightarrow (\delta(S_n, I_n)(l_0) \neq \delta(S_N, I_n)(l_1))]$.

In addition, $M_{k-1}$ must be semi-inductive. Since this description assumes that there is no latch mapping that is semi-inductive and forces output equality, there must exist an output o, an input vector $I_{k-1}$, and a combined state S that satisfies $M_{k-1}$ such that $\gamma_{Impl}(S_{Impl}, I_{k-1})(o) \neq \gamma_{Spec}(S_{Spec}, I_{k-1})(o)$.

Let $S_{k-1}$ be the combined state S. To isolate a bug, the user is shown 410 the combinational blocks that drive o in the implementation and the specification, and shown the latches that are local inputs to those blocks. In addition, the user is queried 412 as to whether there are displayed latches that should be mapped together in $M_n$ but are not. The number of latches being considered at this stage is typically much smaller than the total number of latches, so deciding which latches should be mapped together but are not is much easier than manually mapping the full circuits.

If there are no latches that should be mapped together but are not, i.e., all of the latches that should be mapped together are mapped together in $S_{k-1}$, then there must be a bug 416 in the combinational block driving o in the implementation. Since the bug has been localized to a particular combinational block, the user can continue with any debugging technique that is applicable to combinational circuits.

If there are latches that should be mapped together but are not, the user preferably indicates 418 the latches that should be so mapped. Then, n is repeatedly decremented until $l_0$ and $l_1$ are mapped together in $M_n$.

Once a new mapping $M_n$ is found 418, the process returns to step 410. During subsequent iterations of the process for localizing bugs, the user is shown 410 the latches that are local inputs to the combinational blocks driving the latches that were mapped in the previous iteration $S_{n-1}$. Thus, if all of the latches that should be mapped together have the same value in $S_n$, then there must be a bug in the combinational block driving the latch in the implementation. At this point, a bug has been localized to a particular combinational block 416 and the user can continue with any debugging technique that is applicable to combinational circuits.

The bug localizing procedure of FIG. 4 is guaranteed to terminate because one of the combinational blocks is definitely buggy and all latches are mapped together in $M_0$. After the procedure terminates, the user has been guided to a buggy combinational block in the implementation.

As described above, the bug localization algorithm of FIG. 4 depends on having the sequences $\{M_n\}$, $\{S_n\}$, and $\{I_n\}$ stored from the execution of the latch mapping algorithm of FIG. 3. $\{M_n\}$ can be stored inexpensively by storing the differences between $M_{n-1}$ and $M_n$ instead of storing $M_n$ for each $n \geq 1$. The sequences $\{S_n\}$ and $\{I_n\}$ are more expensive to store. Accordingly, a preferred embodiment of the present invention does not store $\{S_n\}$ and $\{I_n\}$ but instead recomputes the values as needed during bug localization. Since randomization is involved, it is possible that the $\{S_n\}$ and $\{I_n\}$ computed during latch mapping will be different than that computed during bug localization. The desired effects of the algorithms are still achieved, nonetheless.

FIG. 5 is a flowchart illustrating steps performed by a preferred embodiment of the present invention to determine whether assumptions must be made about whether $M^*$ conforms with the reset condition (decision 218 in FIG. 2). Assume that a latch mapping $M^*$ is a fixed point of a refinement function $\Phi$ and that $M^*$ forces output equality. It is necessary to determine whether $M^*$ satisfies the reset condition so that Theorem 3 can be used to show conformance.

Recall that M* satisfies the reset condition iff:

$$\forall S_{Impl} \in R_{Impl}[\exists S_{Spec} \in R_{Spec}[P_{M^*}(S_{Impl} \cup S_{Spec})]].$$

This condition is satisfied iff:

$$\forall S_{Impl} \forall R_{Impl} \exists l_0 \exists l_1 \forall L_{Impl}[P_{M^*}(l_0, l_1) \Rightarrow (S_{Impl}(l_0) = S_{Impl}(l_1))].$$

In other words, if no two implementation latches $l_0$ and $l_1$ are mapped together by M* 510, then conformance is guaranteed 512. Otherwise, $R_{Impl}$ can only include reset states where $l_0$ and $l_1$ have the same value 514. In conclusion, if M* is the greatest fixed point of a refining function Φ, M* forces output equality, and the set of implementation reset states $R_{Impl}$ is restricted as described above, then Theorem 3 can be used to show that the implementation circuit conforms to the specification circuit.

2. Ternary Latch Mappings

"Don't care" conditions should also be taken into consideration when comparing two circuits. A don't care condition, typically represented by an "X" in the specification description, means that the value of the logic element is unspecified. The latch mapping method and system described above can be extended to work with ternary logic having don't care conditions.

To extend the latch mapping method and system, define a partial order $\subseteq^x$ on $\{0, 1, X\}$ such that $u \subseteq^x v \Leftrightarrow u = v \lor v = X$. The inputs, outputs, latches, transition functions, output functions, and reset states of the implementation and the specification are the same in the ternary case as in the Boolean case, except that they are extended to ternary values. In addition, the reset condition is the same in the ternary case as in the Boolean case.

The implementation conforms to the specification for the initial combined state $S_0$ iff for all input vectors I and all combined states S reachable from $S_0$, $\gamma_{Impl}(S_{Impl}, I) \subseteq^x \gamma_{Spec}(S_{Spec}, I)$. Let P be the set of all states $S_0$ such that the implementation conforms to the specification for the initial combined state $S_0$. The implementation conforms to the specification iff P satisfies the reset condition.

The notion of a semi-inductive predicate is analogous to the Boolean case. A predicate P forces output conformance if $\forall S \forall I [P(S) \Rightarrow \gamma_{Impl}(S_{Impl}, I) \subseteq^x \gamma_{Spec}(S_{Spec}, I)]$. In the ternary case, a mapping M is a pre-order over L. A pre-order is any relation satisfying:

1) $M(l_0, l_1)$ $_{and\ M(l_1,\ l_2)} \Rightarrow M(l_0, l_2)$; and
2) $M(l_0, l_0)$. In addition, a pre-order is also a partial order if it satisfies:
3) $M(l_0, l_1)$ and $M(l_1, l_0) \Rightarrow l_0 = l_1$.

Let $P_M$ be the set of states that satisfy M: $P_M(S) \Leftrightarrow \forall l_0$, $l_1[M(l_0, l_1) \Rightarrow S(l_0) \subseteq^x S(l_1)]$. The definition of a refinement for ternary latch mappings is analogous to the Boolean case. Theorems 1, 2 and 3 are also true in the ternary case. Theorems 6 and 7, given below, are analogous to Theorems 4 and 5, respectively.

Theorem 6: If M is a fixed point of a refining function Φ, forces output conformance, and satisfies the reset condition, then the implementation conforms to the specification.

Theorem 7: Let M* be the greatest fixed point of a refining function Φ. Assume that M* does not force output conformance. Then, there does not exist a latch mapping M that is semi-inductive and forces output conformance.

Figures 6, 7:
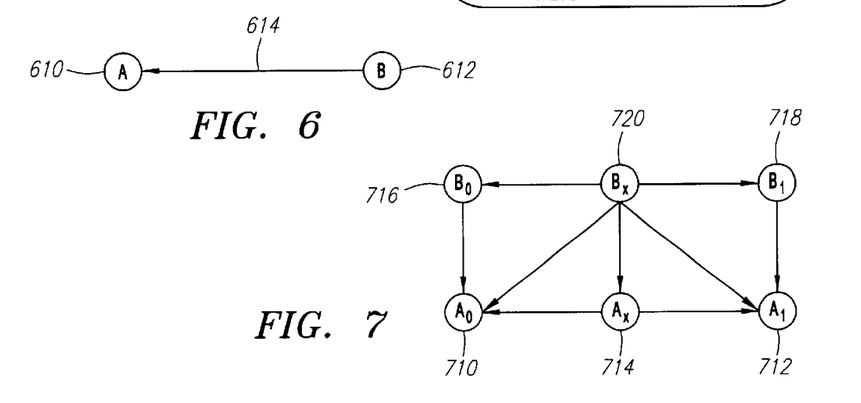
FIG. 6 illustrates a latch mapping with two classes.
FIG. 7 shows a possible result of using S and I to refine the mapping illustrated by FIG. 6.

Since a latch mapping is a pre-order in the ternary case rather than an equivalence relation, the mapping M described with respect to FIG. 3 can no longer be represented with just a partitioning of classes. Instead, the partitioning must be augmented with links between the classes to indicate any one-way conformance relationships between the classes. When a first class of latches conforms with a second class of latches, but the second class of latches does not conform with the first class, the first class of latches is said to be strictly "less" than the second class. For example, FIG. 6 illustrates a latch mapping with two classes, A 610 and B 612. The link 614 indicates that all of the latches in A 610 are less than all of the latches in B 612, meaning that the latches in class A conform with the latches in class B, but the latches in class B do not conform with the latches in class A.

The refinement function Φ, described above, is also more complicated in the ternary case. Consider a combined state S and an input vector I. Let $A_0$ be the set of latches 1 in A such that $\delta(S, I)(1) = 0$. $A_1, A_x, B_0, B_1$, and $B_x$ are analogously defined. Assume that $A_0, A_1, A_x, B_0, B_1$, and $B_x$ are all nonempty. FIG. 7 shows a possible result of using S and I to refine the mapping illustrated by FIG. 6. In the refined mapping of FIG. 7, $A_0$ 710 is less than $A_x$ 714, $B_0$ 716, and $B_x$ 720, $A_1$ 712 is less than $A_x$ 714, $B_x$ 720, and $B_1$ 718. In addition, $A_x$ 714, $B_0$ 716, and $B_1$ 718 are all less than $B_x$ 720.

Figure 8A:
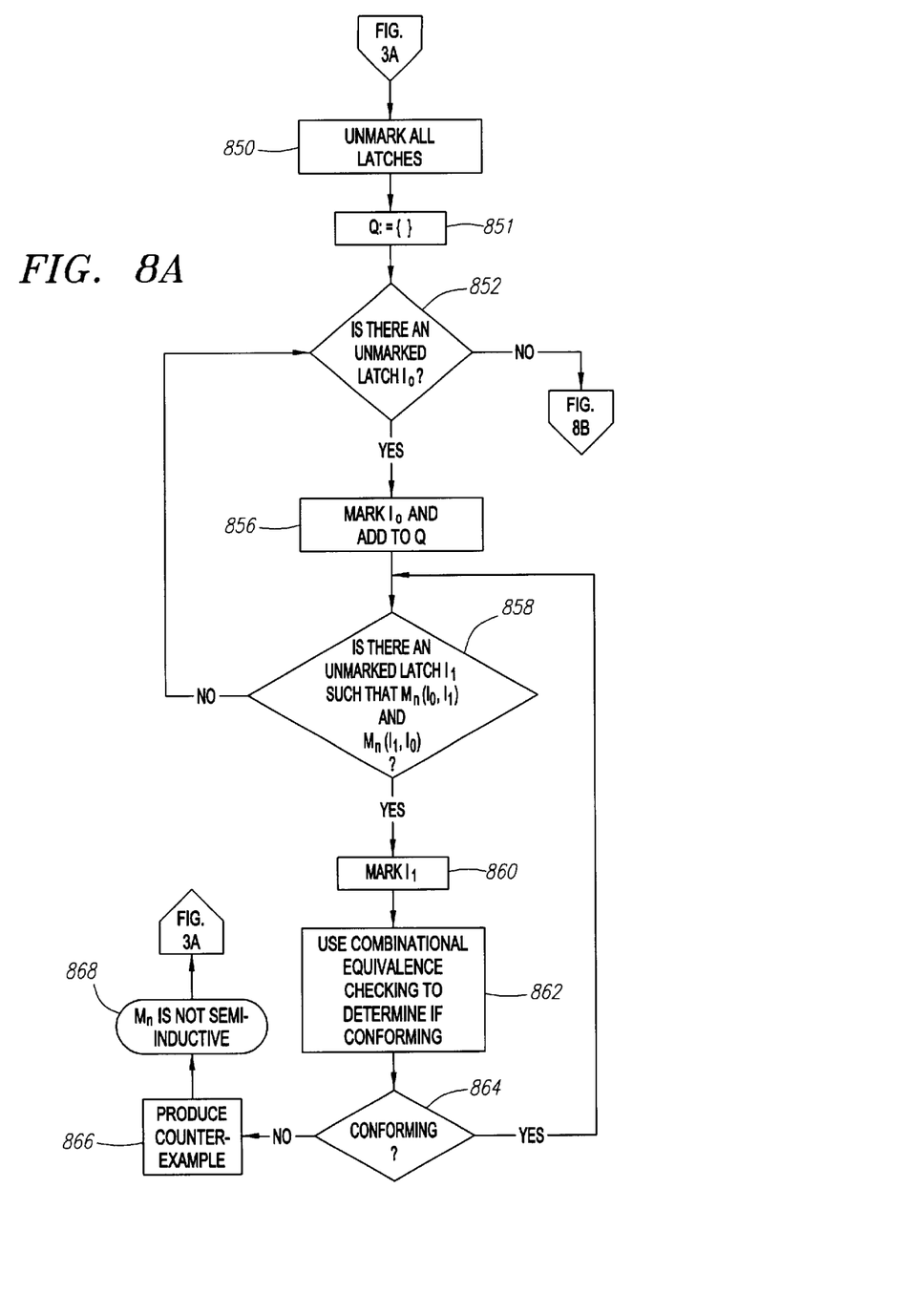
FIGS. 8A and 8B are flowcharts illustrating steps for performing combinational conformance checking with ternary latch mappings.
Figure 8B:
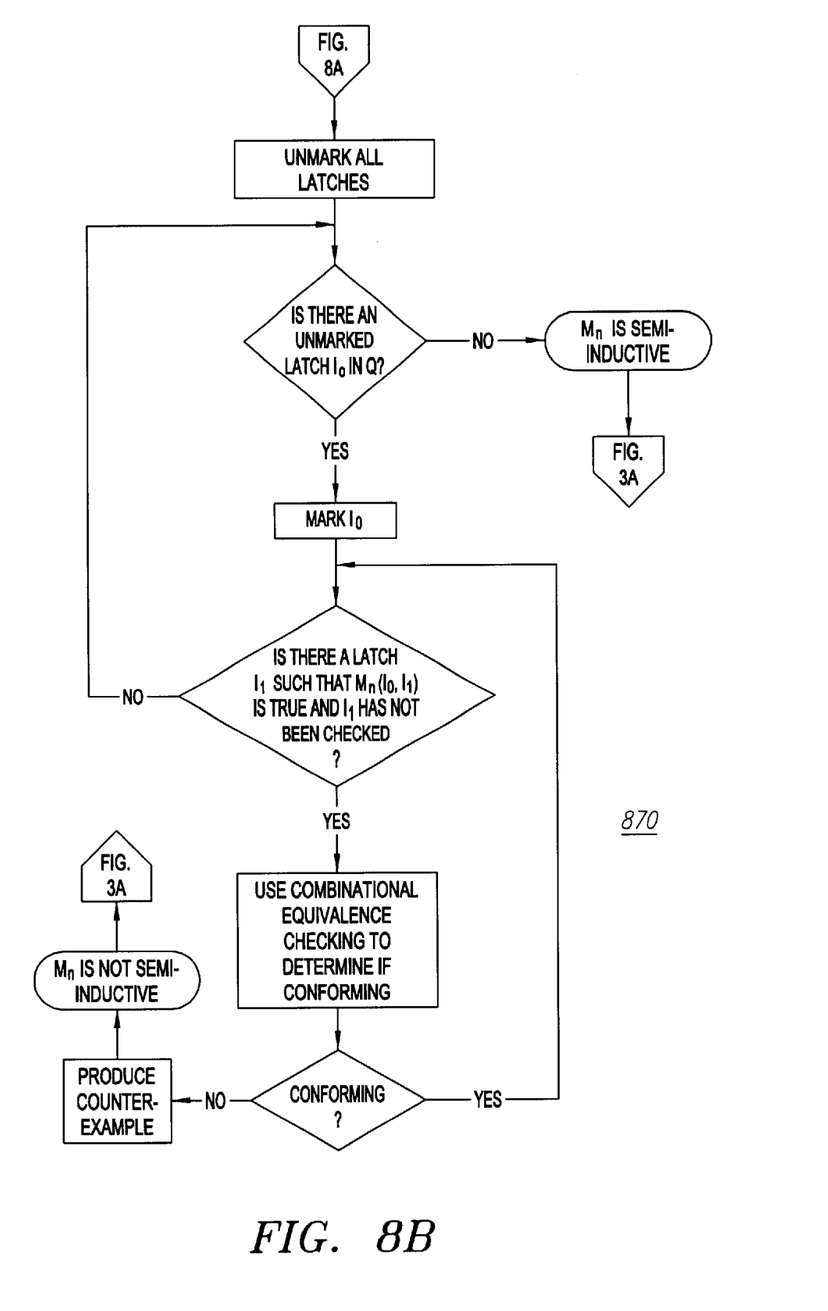

A method for performing combinational conformance checking with ternary latch mappings is illustrated in FIGS. 8A and 8B, in combination with FIG. 3A. The initial steps of ternary combinational conformance checking are identical to those illustrated in FIG. 3A with respect to binary equivalence checking. When used in the ternary case, however, step 318 constructs conformance relationships like those shown in FIGS. 6 and 7 rather than simple equivalence mappings. In addition, step 324 uses the steps of FIGS. 8A and 8B to perform combinational equivalence checking to determine 324 whether $M_n$ is semi-inductive, rather than using the steps of FIG. 3B.

FIG. 8A is similar to FIG. 3B and those steps having similar reference numerals (e.g., 350 and 850) are substantially identical except that the steps of FIG. 8A test for a conformance relationship and have the other differences described herein. Since different classes of latches can still be mapped together in conformance relationships, an empty set of latches Q is defined 851. When a latch $l_0$ is marked 856 as visited, the latch $l_0$ is also added 856 to the defined set of latches Q. These steps cause the set of latches Q to have a representative latch from each class of latches. In this embodiment, the set Q contains the first considered latch in each class, although different embodiments select different representative latches for the set Q. In addition, when checking mappings 858, the only latch pairs $l_0$ and $l_1$ considered are such that both $M(l_0, l_1)$ and $M(l_1, l_0)$ are true.

When every latch $l_0$ has been marked 852, meaning that the latches have been partitioned into classes and Q contains a representative latch from each class, the steps of FIG. 8B are performed to test for conformance relationships among the classes. As can be easily observed, FIG. 8B is extremely similar to FIGS. 3B and 8A except that the steps of FIG. 8B test for conformance among only the latches in the set Q. In brief, the steps of FIG. 8B, collectively identified by reference numeral 870, test every latch in Q for conformance with other latches in Q. If conformance is found between two latches $l_0, l_1$, then the classes containing the latches also conform.

In conclusion, the present invention is a system and method for latch mapping that does not depend on signal names or circuit structure. The method and system can be applied to circuits with reset sequences. In the case where the implementation does not conform to the specification, an interactive procedure is described for identifying a particular combinational block having a bug. The described system and method can be extended with ternary values to determine whether an implementation conforms to a specification given the presence of don't care conditions.

We claim:

1. A method of determining correspondence between memory elements of a first circuit design with memory elements of a second circuit design, the method comprising the steps of:

constructing a semi-inductive mapping indicating relationships among the memory elements in the first and second circuit designs;

determining whether the semi-inductive mapping forces equality on corresponding outputs of the first and second circuit designs; and responsive to a determination that the semi-inductive mapping does not force output equality, determining a location of an error in the second circuit design.

2. The method of claim 1, wherein the constructing step comprises the steps of:

mapping every memory element in the first circuit design with every other memory element in the first and second circuit designs.

3. The method of claim 1, wherein the constructing step comprises the steps of:

mapping the memory elements in the first and second circuit designs according to reset condition constraints provided with the first circuit design.

4. The method of claim 1, wherein the constructing step comprises the steps of:

producing a state of the memory elements in the first and second circuit designs that satisfies an initial mapping;

applying an input vector to the first and second circuit designs and determining a resulting state of the memory elements in the first and second circuit designs;

determining whether the resulting state of the memory elements in the first and second circuit designs satisfies the initial mapping; and responsive to the resulting state of the memory elements in the first and second circuit designs not satisfying the initial mapping:

constructing a new mapping satisfying the combined state of the memory elements in the first and second circuit designs;

responsive to the resulting state of the memory elements in the first and second circuit designs satisfying the initial mapping:

determining whether logic blocks within the first and second circuit designs and respectively coupled to the memory elements in the first and second circuit designs are equivalent.

5. The method of claim 4, wherein the step of determining whether logic blocks of the first and second circuit designs respectively coupled to the memory elements in the first and second circuit designs are equivalent comprises the steps of:

for each set of memory elements mapped together and while the logic blocks within the first and second circuit designs are equivalent, determining whether the logic blocks within the first and second circuit designs having outputs respectively driving inputs of the memory elements of the first and second circuit designs mapped together in the set are equivalent.

6. The method of claim 1, wherein the step of determining a location of an error in the second circuit design comprises the steps of:

selecting a first mapping of memory elements in the first and second circuit designs; and responsive to a determination that memory elements mapped together in the selected first mapping have different values, determining a second mapping of memory elements in the first and second circuit designs consistent with the first selected mapping.

7. The method of claim 6, wherein the step of selecting a first mapping of memory elements in the first and second circuit designs comprises the steps of:

displaying inputs to logic blocks driving the outputs of the first and second circuit designs; and accepting a user-selected mapping of the displayed inputs.

8. The method of claim 1, wherein particular memory elements of the first and second circuit designs can have one of at least three states and wherein the constructing step comprises the step of:

constructing a pre-order of memory elements in the first and second circuit designs.

9. The method of claim 8, wherein the step of constructing a pre-order of memory elements comprises the steps of:

partitioning the memory elements in the first and second circuit designs into one or more classes; and providing links among the one or more classes indicating conformance relationships among the memory elements in the classes.

10. A system for establishing a relationship between memory elements of a first circuit designs and memory elements of a second circuit design derived from the first circuit design, the system comprising:

a module for dividing the memory elements of the first and second circuit designs into a partitioning comprising a plurality of classes having links between the classes representing conformance relationships among the classes;

a module for refining the partitioning until a greatest fixed point of partitioning is determined;

a module for determining whether the greatest fixed point of partitioning forces conformance at corresponding outputs of the first and second circuit designs; and a module for determining whether the greatest fixed point of partitioning guarantees conformance with a reset condition applied to the circuit designs.

11. The system of claim 10, wherein the memory elements can have one of three values.

12. The system of claim 10, wherein the module for refining the partitioning comprises:

a module for computing a state of the memory elements from an input vector applied to inputs of the first and second circuit designs;

a module for determining w ether the state of the memory elements conforms with the partitioning;

a module for computing a new partitioning from the partitioning and the state of the memory elements responsive to a determination that the state of the memory elements does not conform with the partitioning; and a module for determining whether the memory elements in each class conform responsive to a determination that the state of the memory elements conforms with the partitioning.

13. The system of claim 12, wherein the module for determining whether the memory elements in each class conform further comprises:

a module for producing a vector demonstrating the non-conformance responsive to a determination that the memory elements in each partition do not conform.

14. The system of claim 10, further comprising:
a module for locating an error in the second circuit design responsive to a determination that the greatest fixed point of partitioning does not force conformance at corresponding outputs of the first and second circuit designs.

15. The system of claim 14, wherein the module for locating an error comprises:
a module for accepting a partitioning of a subset of the memory elements in the first and second circuit designs; and
a module for generating a new partitioning of the memory elements in the first and second circuit designs conforming with the accepted partitioning of the subset of the memory elements.

16. The system of claim 10, wherein the module for determining whether the greatest fixed point of partitioning guarantees conformance with a reset condition applied to the circuit designs comprises:
a module for determining whether a plurality of memory elements in the second circuit design are within a same partition.

17. A computer program product having a computer-readable medium having computer-program instructions encoded thereon for determining correspondence between memory elements of a first circuit design and memory elements of a second circuit design derived from the first circuit design, the computer program instructions comprising:
instructions for constructing a greatest fixed point mapping indicating relationships among memory elements in the first and second circuit designs;
instructions for determining whether the greatest fixed point mapping forces equality of corresponding outputs on the first and second circuit designs; and
instructions for locating an error in the second circuit design responsive to a determination that the greatest fixed point mapping does not force equality of corresponding outputs.

18. The computer program product of claim 17, wherein the computer program instructions for locating the error in the second circuit design comprise:
instructions for receiving a first mapping of memory elements in the first and second circuit designs; and
instructions for determining a second mapping of memory elements in the first and second circuit designs consistent with first selected mapping responsive to a determination that the memory elements in the selected first mapping have different values.

19. The computer program product of claim 18, wherein the instructions for receiving a first mapping of memory elements in the first and second circuit designs comprise:
instructions for displaying inputs to combinational blocks driving the outputs of the first and second circuit designs; and
instructions for accepting a user-selected mapping of the displayed inputs.

20. A method of determining correspondence between memory elements of a first circuit design with memory elements of a second circuit design, the method comprising the steps of:
constructing a semi-inductive mapping indicating relationships among the memory elements in the first and second circuit designs wherein the mapping is represented by a predicate P such that memory elements $l_1$ and $l_2$ are mapped together if and only if $P(l_1, l_2)$ is true and P is semi-inductive if:

$$\forall S \; \forall I \; [P(S) => P(\delta(S,I))]$$

where I is a given input vector, S is a state and $\delta$ is a transition function; determining whether the semi-inductive mapping forces equality on corresponding outputs of the first and second circuit designs wherein P forces equality if and only if $\forall S \; \forall I \; [P(S) => P(\gamma(S,I))]$ where $\gamma$ is an output function; and
responsive to a determination that the semi-inductive mapping does not force output equality, determining a location of an error in the second circuit design.

* * * * *